(12) United States Patent
Jain et al.

(10) Patent No.: US 12,389,622 B2
(45) Date of Patent: Aug. 12, 2025

(54) HIGH ELECTRON MOBILITY TRANSISTOR DEVICES HAVING A SILICIDED POLYSILICON LAYER

(71) Applicant: GlobalFoundries U.S. Inc., Malta, NY (US)

(72) Inventors: Vibhor Jain, Clifton Park, NY (US); Johnatan Avraham Kantarovsky, South Burlington, VT (US); Mark David Levy, Williston, VT (US); Ephrem Gebreselasie, South Burlington, VT (US); Yves Ngu, Birchwood Drive Hinesburg, VT (US); Siva P. Adusumilli, South Burlington, VT (US)

(73) Assignee: GlobalFoundaries Singapore Pte. Ltd., Singapore (SG)

( * ) Notice: Subject to any disclaimer, the term of this patent is extended or adjusted under 35 U.S.C. 154(b) by 40 days.

(21) Appl. No.: 18/487,115

(22) Filed: Oct. 15, 2023

(65) Prior Publication Data
US 2024/0038882 A1    Feb. 1, 2024

Related U.S. Application Data

(62) Division of application No. 17/503,345, filed on Oct. 17, 2021, now Pat. No. 11,923,446.

(51) Int. Cl.
*H10D 30/47* (2025.01)
*H10D 30/01* (2025.01)
(Continued)

(52) U.S. Cl.
CPC ......... *H10D 30/472* (2025.01); *H10D 30/015* (2025.01); *H10D 64/117* (2025.01); (Continued)

(58) Field of Classification Search
CPC .. H10D 30/472; H10D 30/015; H10D 64/117; H10D 64/605; H10D 64/661; H10D 64/671; H10D 84/406; H10D 84/852; H10D 84/87; H10D 84/957; H10H 20/835; H10H 20/818; B65D 83/182; A61K 40/4233; H02K 15/38; H02K 15/90; H10F 19/90; H10F 39/1843
See application file for complete search history.

(56) References Cited

U.S. PATENT DOCUMENTS 9,214,461 B2    12/2015  Cao et al.
10,312,260 B2    6/2019  Cao et al.
(Continued)

*Primary Examiner* — Mohammad A Rahman
(74) *Attorney, Agent, or Firm* — Francois Pagette

(57) ABSTRACT

The present disclosure relates generally to structures in semiconductor devices and methods of forming the same. More particularly, the present disclosure relates to high electron mobility transistor (HEMT) devices having a silicided polysilicon layer. The present disclosure may provide an active region above a substrate, source and drain electrodes in contact with the active region, a gate above the active region, the gate being laterally between the source and drain electrodes, a polysilicon layer above the substrate, and a silicide layer on the polysilicon layer. The active region includes at least two material layers with different band gaps. The polysilicon layer may be configured as an electronic fuse, a resistor, or a diode.

19 Claims, 13 Drawing Sheets

(51) Int. Cl.
*H10D 64/00* (2025.01)
*H10D 64/60* (2025.01)
*H10D 64/66* (2025.01)

(52) U.S. Cl.
CPC ......... *H10D 64/605* (2025.01); *H10D 64/661* (2025.01); *H10D 64/671* (2025.01)

(56) References Cited

U.S. PATENT DOCUMENTS

| | | | |
|---|---|---|---|
| 2007/0007621 A1* | 1/2007 | Omura | H10B 20/25 257/E21.666 |
| 2015/0028384 A1 | 1/2015 | Cao et al. | |
| 2015/0318353 A1 | 11/2015 | Roberts et al. | |
| 2020/0227407 A1 | 7/2020 | Radosavljevic et al. | |

* cited by examiner

US 12,389,622 B2

HIGH ELECTRON MOBILITY TRANSISTOR DEVICES HAVING A SILICIDED POLYSILICON LAYER

FIELD OF THE INVENTION

The present disclosure relates generally to structures in semiconductor devices and methods of forming the same. More particularly, the present disclosure relates to high electron mobility transistor (HEMT) devices having a silicided polysilicon layer.

BACKGROUND

High electron mobility transistors (HEMT) have become increasingly desirable due to their ability to switch at high frequency, carry large currents, and support high voltages. HEMT devices can typically withstand high voltages (e.g., 600V to 1200V) while operating at high frequencies (e.g., 100 kHz to 100 GHz). Integrated circuit chips having the HEMT devices may also include additional components, such as active or passive components. Examples of these active or passive components can include fuses, anti-fuses, resistors, or diodes. The HEMT device in the integrated circuit chip can be used to program those additional components.

Fuses and anti-fuses are widely used in field programmable devices. An example of a fuse includes an electrically programmable fuse (or an "electronic fuse"). An electronic fuse may operate based on electromigration, where current crowding takes place around a fixed location, thus initiating the electromigration which results in further current crowding and material migration in the direction of the electron movement along the fuse element. This may result in an increase in a few orders of magnitude in the electronic fuse's resistance.

However, for device applications that utilize a HEMT to program the electronic fuse, the HEMT and the electronic fuse may be built on separate dies or wafers. The fabrication of the HEMT and the electronic fuse on different dies or wafers may incur additional manufacturing costs, as well as causing the fabricated chip to have a larger device size and area.

SUMMARY

In an aspect of the present disclosure, there is provided a semiconductor device including an active region above a substrate, the active region including at least two material layers with different band gaps, source and drain electrodes in contact with the active region, a gate above the active region, the gate is laterally between the source and drain electrodes, the gate has an upper surface, a polysilicon layer above the substrate, the polysilicon layer has a lower surface, in which the polysilicon layer is positioned laterally adjacent to the gate and the lower surface of the polysilicon layer is substantially coplanar with the upper surface of the gate, and a silicide layer on the polysilicon layer.

In another aspect of the present disclosure, there is provided a semiconductor device including a buffer layer on a substrate, an active region above the substrate, the active region having a channel layer disposed on the buffer layer, and a barrier layer disposed on the channel layer, source and drain electrodes in contact with the channel layer, a gate on the barrier layer, the gate is laterally between the source and drain electrodes, the gate has an upper surface, a polysilicon layer above the barrier layer, the polysilicon layer has a lower surface, the polysilicon layer is positioned laterally adjacent to the gate, and the lower surface of the polysilicon layer is substantially coplanar with the upper surface of the gate, in which the polysilicon layer includes heavily doped regions and lightly doped regions, and a silicide layer on each of the heavily doped regions.

In yet another aspect of the present disclosure, there is provided a method of forming a semiconductor device by forming an active region above a substrate, the active region including at least two material layers with different band gaps, forming source and drain electrodes to contact the active region, forming a gate above the active region, the gate is laterally between the source and drain electrodes, the gate has an upper surface, forming a polysilicon layer above the substrate, the polysilicon layer has a lower surface, in which the polysilicon layer is positioned laterally adjacent to the gate and the lower surface of the polysilicon layer is substantially coplanar with the upper surface of the gate, and forming a silicide layer on the polysilicon layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Figure 1:
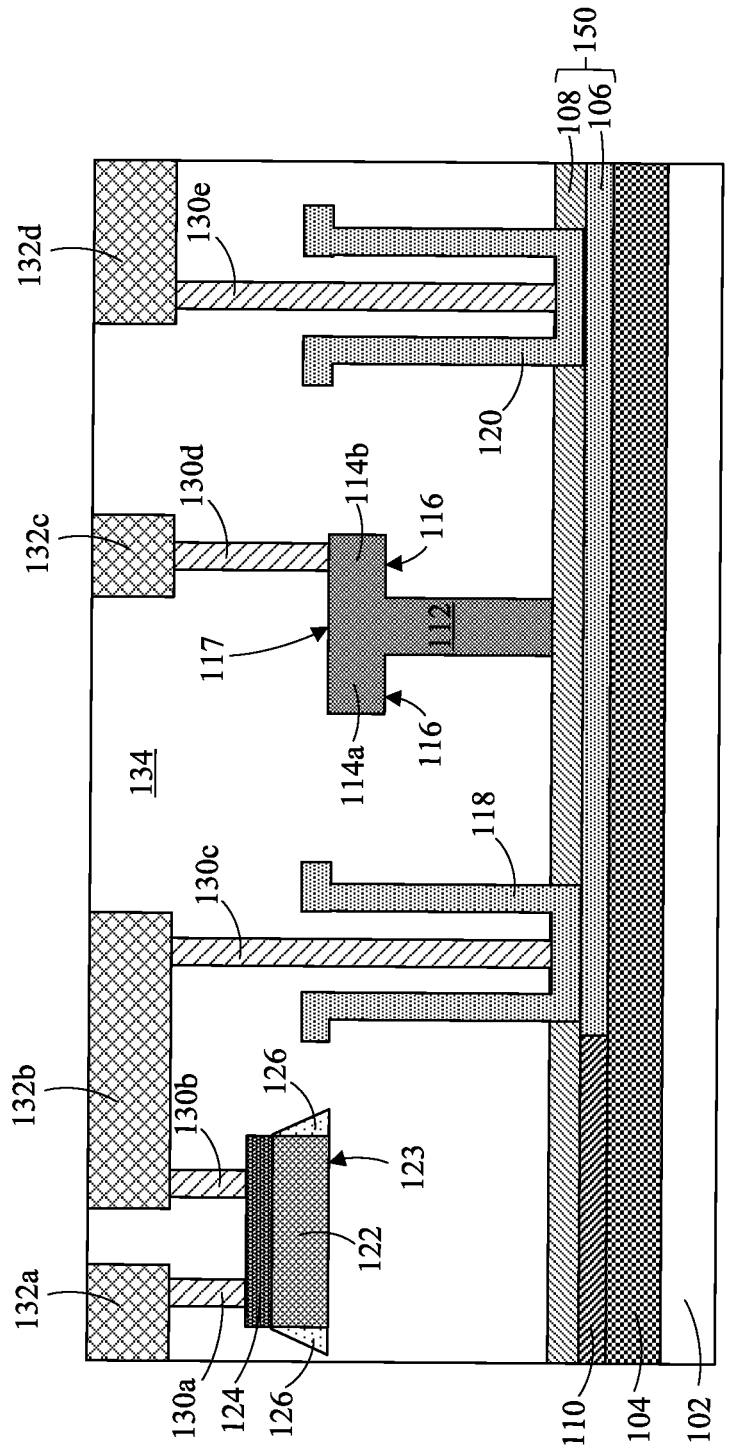
FIG. 1 through FIG. 6 are cross-sectional views of examples of semiconductor devices.

Various illustrative embodiments of the present disclosure are described below. The embodiments disclosed herein are exemplary and not intended to be exhaustive or limiting to the present disclosure.

Referring to FIG. 1, FIG. 2, FIG. 3, and FIG. 4, there are provided examples of a semiconductor device including a substrate 102, an active region 150 above the substrate 102, a source electrode 120 in contact with the active region 150, a drain electrode 118 in contact with the active region 150, a gate 112 above the active region 150, a polysilicon layer 122 above the substrate 102, and a silicide layer 124 on the polysilicon layer 122. The gate 112 is positioned laterally between the source electrode 120 and the drain electrode 118. The polysilicon layer 122 may be electrically connected to either the drain electrode 118 or the source electrode 120.

It should be noted that the relative positions of the drain electrode 118 and the source electrode 120 as illustrated in the accompanying drawings may be interchangeable. For example (as shown), the drain electrode 118 may be positioned laterally between the gate 112 and the polysilicon layer 122. Alternatively (not shown), the source electrode 120 may be positioned laterally between the gate 112 and the polysilicon layer 122. Although not shown in the accompanying drawings, the polysilicon layer 122 may alternatively be electrically connected to the gate 112. As used herein, the term "active region" may refer to a region that provides a pathway for the drifting of electrical charges between the source electrode 120 and the drain electrode 118.

The substrate 102 may include any semiconductor material, such as silicon, germanium, silicon germanium (SiGe), silicon carbide (SiC), and those consisting essentially of III-V compound semiconductors, such as gallium arsenide (GaAs), gallium nitride (GaN), II-VI compound semiconductors such as zinc selenide (ZnSe). Alternatively, the substrate 102 may include sapphire, spinel, zinc oxide (ZnO), aluminum nitride (AlN), or any other material capable of supporting the growth of Group III-nitride materials.

The substrate 102 may be a bulk substrate as illustrated in the accompanying drawings. In alternative embodiments (not shown), the substrate 102 may be a composite substrate structured to have multiple layers of the materials as described hereinbefore. Examples of the composite substrate may include, but are not limited to, a silicon-on-ceramic substrate, Si/SiGe layered substrate, a silicon-on-insulator (SOI) substrate, a germanium-on-insulator (GOI) substrate, or a SiGe-on-insulator substrate.

The gate 112 may modulate the conductance of the active region 150 and control the drifting of electric charges between the source electrode 120 and the drain electrode 118. The gate 112 may include a metallic material such as, but not limited to, tungsten, cobalt, nickel, copper, and aluminum. In some embodiments, the gate 112 may have field plate extensions 114a, 114b that extend laterally from the gate 112 towards the source 120 and drain 118 electrodes. The field plate extensions 114a, 114b may be integrally formed with the gate 112. The gate 112 with the field plate extensions 114a, 114b may be referred to as a "T-shaped" gate or "F-shaped" gate. The inclusion of the field plate extensions 114a, 114b may increase the breakdown voltage of the device. The gate 112 may have an upper surface 117 and each field plate extension 114a, 114b may have a lower surface 116. Alternatively, in other embodiments (not shown), the gate 112 does not have the field plate extensions 114, 114b.

The conductance of the active region 150 may be controlled by the amount of voltage applied to the gate 112. The active region 150 may have various structural configurations depending on the desired type of transistor. The active region 150 includes at least two material layers with different band gaps. In particular, the active region 150 may include a heterostructure having multiple layers of materials. For example, the active region 150 may include a barrier layer 108 disposed on a channel layer 106.

The channel layer 106 may include one or more sub-layers with a desired band gap. The sub-layers may be doped or undoped. The channel layer 106 may include a Group III-V compound, such as, but not limited to, GaAs, indium gallium arsenide (InGaAs), or GaN. In some embodiments, the channel layer 106 may include the same material as the substrate 102. Alternatively, in other embodiments, the channel layer 106 may include a material different than the material in the substrate 102.

The barrier layer 108 has a band gap that is different from the band gap of the channel layer 106. The barrier layer 108 may include one or more sub-layers and may be doped or undoped. The barrier layer 108 may include a Group III-V compound, such as, but not limited to, aluminum gallium arsenide (AlGaAs), indium phosphide (InP), or aluminum gallium nitride (AlGaN).

A heterojunction may be formed at the interface between the barrier layer 108 and the channel layer 106, resulting in the formation of a two-dimensional electron gas (2DEG) (not shown) in the channel layer 106. The 2DEG can provide the conductive pathway for the drifting of charges between the source electrode 120 and the drain electrode 118. For example, the barrier layer 108 and the channel layer 106 may be substantially undoped, and the 2DEG may be induced by polarization mismatches between the barrier layer 108 and the channel layer 106. In this example, the barrier layer 108 and the channel layer 106 may both include Group III-Nitride compounds, such as, but not limited to, GaN, AlN, and AlGaN. In another example, the barrier layer 108 may be more highly doped than the channel layer 106, which forms the 2DEG.

The device may also include a buffer layer 104 between the channel layer 106 and the substrate 102. In particular, the buffer layer 104 may be disposed on the substrate 102. The buffer layer 104 may include group III or group V elements, such as, but are not limited to, AlN, GaN, or AlGaN. The buffer layer 104 may serve to accommodate the lattice mismatch between the channel layer 106 and the substrate 102, and thereby improving the "on" state and "off" state electrical characteristics of the device while accommodating bowing, warping, breakage, or cracks of the substrate 102. The buffer layer 104 may be a superlattice structure with multiple sub-layers, or alternatively, be structured as a single layer. The term "buffer layer" may alternatively be referred to as a "transitional layer".

The device may further include an isolation layer 110 disposed on the buffer layer 104. The isolation layer 110 may be laterally adjacent to channel layer 106. The barrier layer 108 may be disposed on the isolation layer 110 such that the isolation layer 110 is positioned between the barrier layer 108 and the buffer layer 104. In some embodiments, the isolation layer 110 may be a mesa-isolated layer or an implant-isolated layer. In other embodiments (not shown), the isolation layer 110 may be absent.

The source electrode 120 and the drain electrode 118 may contact the active region 150 in various configurations. For example, the gate 112 may be disposed on the barrier layer 108. The source electrode 120 and the drain electrode 118 may contact or directly contact the channel layer 106 through the barrier layer 108 such that an electric current may flow between the source electrode 120 and the drain electrode 118 when the gate 112 is biased by a voltage. In other embodiments (not shown), the source electrode 120 and the drain electrode 118 may contact or directly contact the barrier layer 108 and form an electrical connection with the channel layer 106 through a diffusion-based thermal process.

An interlayer dielectric region 134 may be disposed over the gate 112, the source electrode 120, and the drain electrode 118. The interlayer dielectric region 134 may include one or more dielectric layers. The dielectric layers in the interlayer dielectric region 134 may include silicon nitride, silicon dioxide, tetraethyl orthosilicate (TEOS), or a material having a chemical composition of $SiC_xO_yH_z$, wherein x, y, and z are in stoichiometric ratio.

The polysilicon layer 122 may be disposed in the interlayer dielectric region 134 and may be positioned above the buffer layer 104. The polysilicon layer 122 may be preferably positioned laterally adjacent to the gate 112. The polysilicon layer 122 may be doped with dopants to have at least one doped region. For example, the polysilicon layer 122 may have a doped region with either a P-type conductivity or an N-type conductivity. Exemplary dopants for N-type conductivity may include, but are not limited to, arsenic, phosphorus, or antimony. Exemplary dopants for P-type conductivity may include, but are not limited to, boron, aluminum, or gallium. The polysilicon layer 122 may be disposed in the interlayer dielectric region 134 and the polysilicon layer 122 is also above the substrate 102. In embodiments where the isolation layer 110 is present, the polysilicon layer 122 may be positioned above or directly above the isolation layer 110 such that the polysilicon layer 122 is vertically aligned with the isolation layer 110. In embodiments where the isolation layer 110 is absent, the polysilicon layer 122 may be positioned above or directly above the active region 150. In particular, the polysilicon layer 122 may be positioned above or directly above the barrier layer 108.

A silicide layer 124 is disposed on the polysilicon layer 122. For example, the silicide layer 124 may be disposed on an upper surface of the polysilicon layer 122. The silicide layer 124 may include a metal silicide material. Examples of the metal silicide material for the silicide layer 124 may include, but are not limited to, nickel silicide, nickel-platinum silicide, cobalt silicide, titanium silicide. The silicide layer 124 may have a thickness in the range of about 5 nm to about 60 nm.

Figure 2:
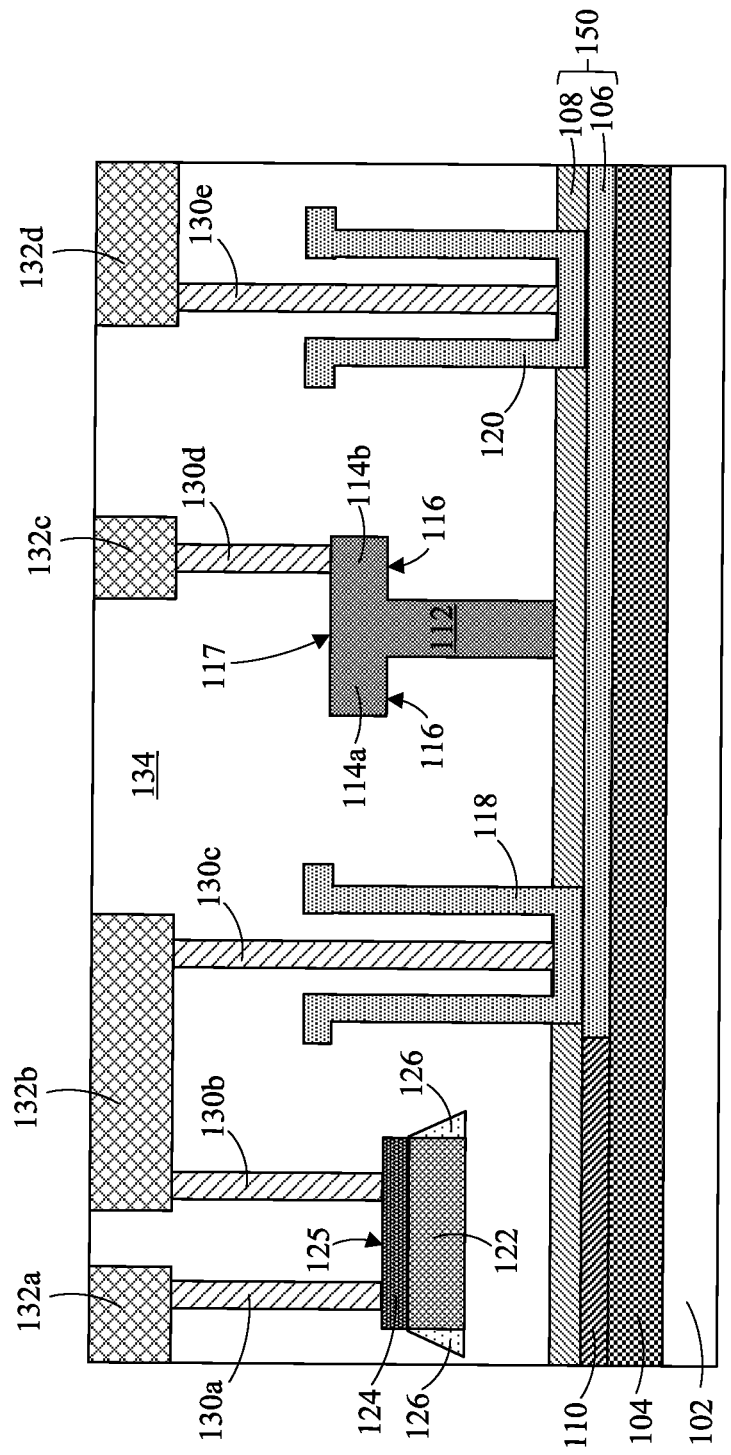
Figure 3:
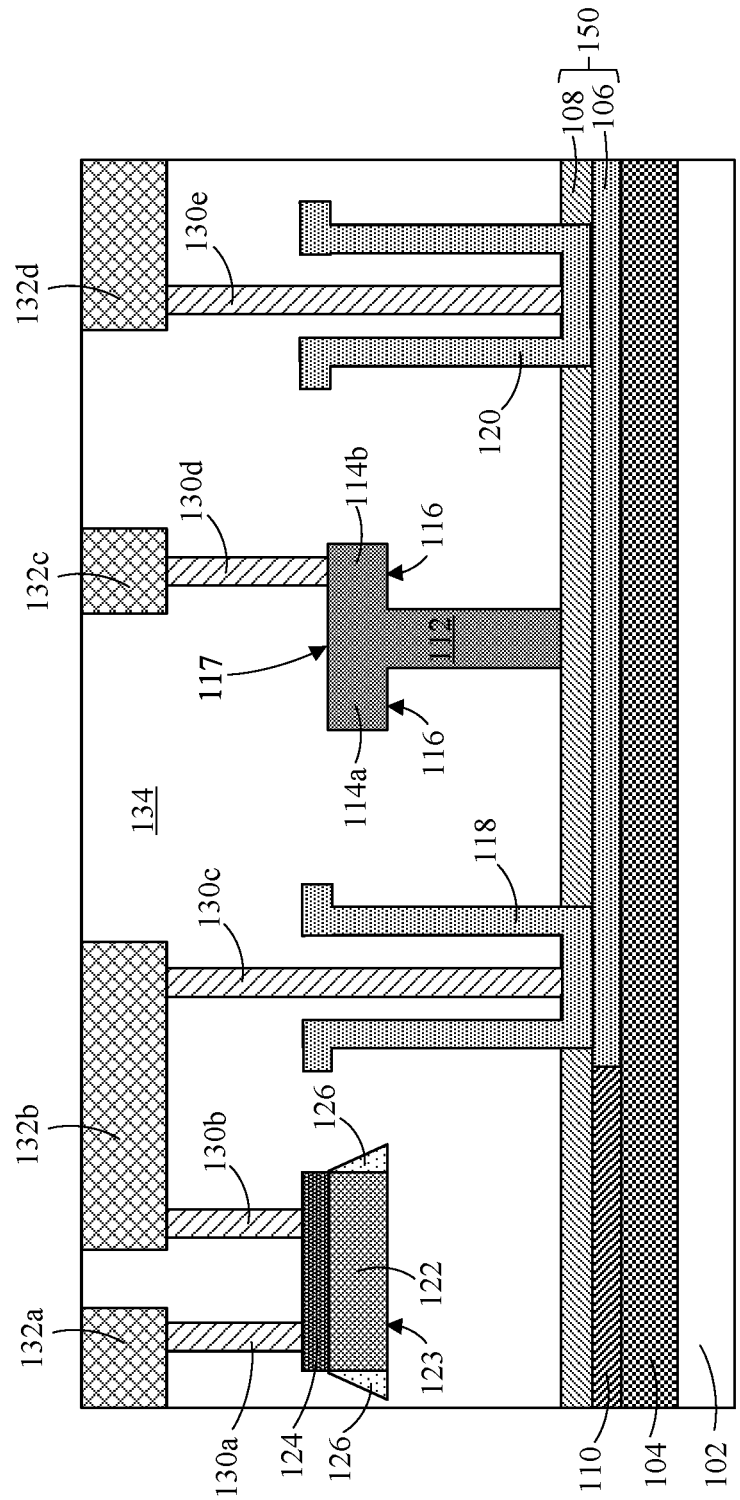

The polysilicon layer 122 may be positioned laterally adjacent to the gate 112 in various configurations. The polysilicon layer 122 may have a lower surface 123. The lower surface 123 of the polysilicon layer 122 may be substantially coplanar with, or at a lower elevation than, the upper surface 117 of the gate 112. For example, as shown in FIG. 1, the lower surface 123 of the polysilicon layer 122 may be substantially coplanar with the upper surface 117 of the gate 112. In examples shown in FIG. 2, FIG. 3, FIG. 4, the lower surface 123 of the polysilicon layer 122 may be at a lower elevation than the upper surface 117 of the gate 112. As shown in FIG. 2, the silicide layer 124 has an upper surface 125. The upper surface 125 of the silicide layer 124 may be substantially coplanar with, or at a lower elevation than, the lower surfaces 116 of the field plate extensions 114a, 114b. As shown in FIG. 3, the lower surface 123 of the polysilicon layer 122 may be substantially coplanar with, or at a lower elevation than, the lower surfaces 116 of the field plate extensions 114a, 114b. Spacers 126 may be disposed on sidewalls of the polysilicon layer 122. The spacers 126 may include a nitride material, such as silicon nitride.

Figure 4:
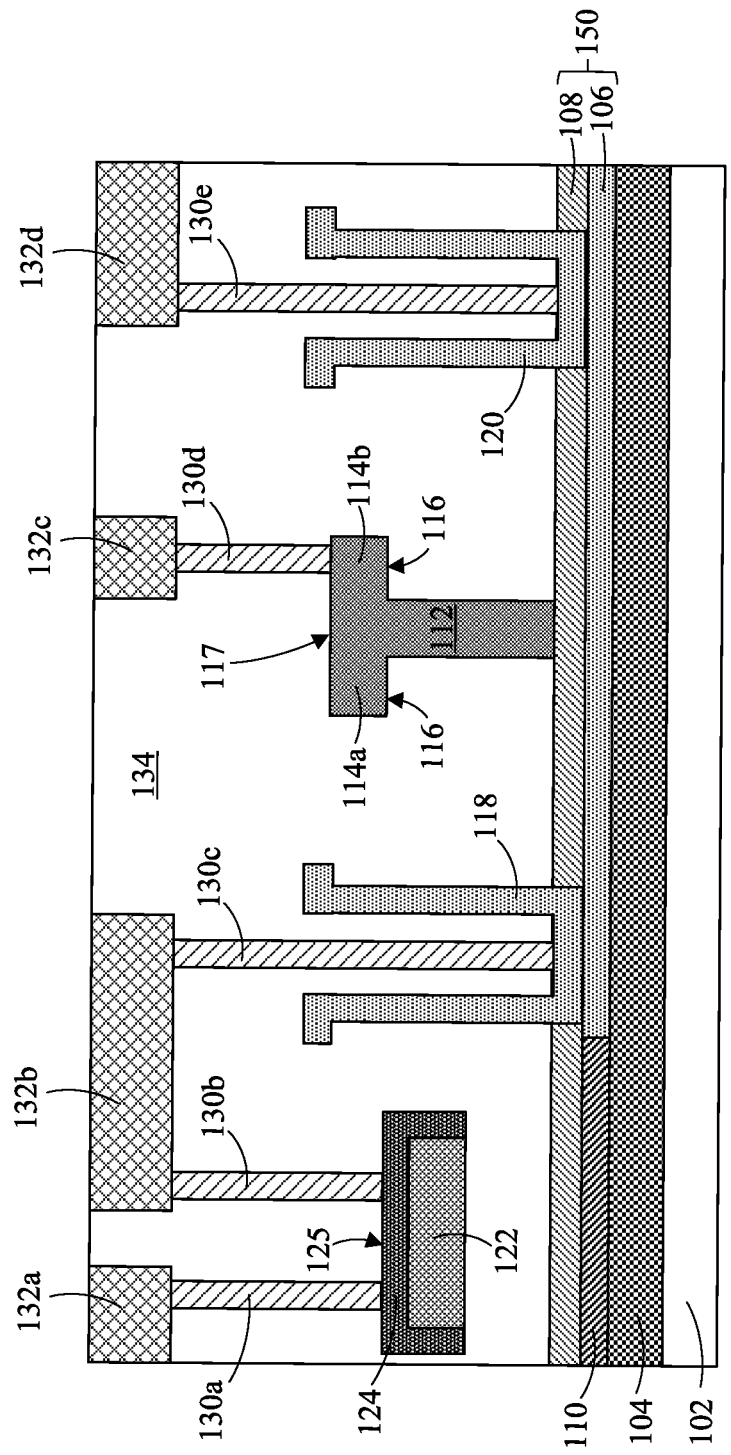

In the example shown in FIG. 4, the spacers 126 may be absent from the sidewalls of the polysilicon layer 122. In particular, the silicide layer 124 may extend to lie over the sidewalls of the polysilicon layer 122. The upper surface 125 of the silicide layer 124 may be substantially coplanar with, or at a lower elevation than, the lower surfaces 116 of the field plate extensions 114a, 114b. Alternatively (not shown), the lower surface 123 of the polysilicon layer 122 may be substantially coplanar with, or at a lower elevation than, the lower surfaces 116 of the field plate extensions 114a, 114b.

Various interconnect features, such as interconnect vias 130a, 130b, 130c, 130d, 130e, and metal lines 132a, 132b, 132c, 132d, may be disposed in the interlayer dielectric region 134. As shown, interconnect vias 130a, 130b contact the silicide layer 124, interconnect via 130c contacts the drain electrode 118, interconnect via 130d contacts the gate 112, and interconnect via 130e contacts the source electrode 120. Each metal line 132a, 132b, 132c, 132d may be connected to at least one interconnect via 130a, 130b, 130c, 130d, 130e. The electrical connection between the drain electrode 118 and the polysilicon layer 122 may be provided by a connection through the silicide layer 124, interconnect vias 130b, 130c, and the metal line 132b.

Advantageously, by positioning the polysilicon layer 122 laterally adjacent to the gate 112, the polysilicon layer 122 can be positioned in the front end of line (FEOL) portion of an integrated circuit chip. By positioning the polysilicon layer 122 in the FEOL portion of the integrated circuit chip, the silicide layer 124 can be formed on the polysilicon layer 122. The presence of the silicide layer 124 may provide a lower contact resistance between the interconnect vias 130b, 130c and the polysilicon layer 122. Additionally, the presence of the silicide layer 124 may enable the polysilicon layer 122 to be configured as an electronic fuse. On the other hand, if the polysilicon layer 122 had been positioned in the back end of line (BEOL) portion of an integrated circuit chip (e.g., at a level above the metal lines 132a, 132b, 132c, 132d), it may not be possible to form a silicide layer on the polysilicon layer 122 without damaging other device components in the BEOL portion of the integrated circuit chip, since the formation of the silicide layer (i.e., a silicidation process) on the polysilicon layer 122 may include an annealing step.

In some embodiments, the polysilicon layer 122 may be configured as an electronic fuse. In embodiments where the polysilicon layer 122 is configured as an electronic fuse, the polysilicon layer 122 may be doped or undoped. The gate 112 may be configured to program the electronic fuse. For example, a pulse voltage may be applied to turn on the gate 112 and allow a current flow between the source electrode 120 and the drain electrode 118. The current flow from the drain electrode 118 may be sufficient to break the electronic fuse in the polysilicon layer 122. In other embodiments, the polysilicon layer 122 may be configured as a resistor. In embodiments where the polysilicon layer 122 is configured as a resistor, the polysilicon layer 122 may be doped.

The semiconductor devices described herein may include a HEMT device. Examples of a HEMT may include, but are not limited to, an aluminum gallium nitride (AlGaN)/gallium nitride (GaN) HEMT, a pseudomorphic HEMT (PHEMT) (e.g., a gallium arsenide (GaAs) PHEMT), a metamorphic HEMT (mHEMT) (e.g., a GaAs mHEMT), a metal insulator semiconductor high electron mobility transistor (MISHEMT). The polysilicon layer 122 can be integrated into a HEMT device by positioning the polysilicon layer 122 above the barrier layer 108, the channel layer 106, the buffer layer 104, and the substrate 102.

Figure 5:
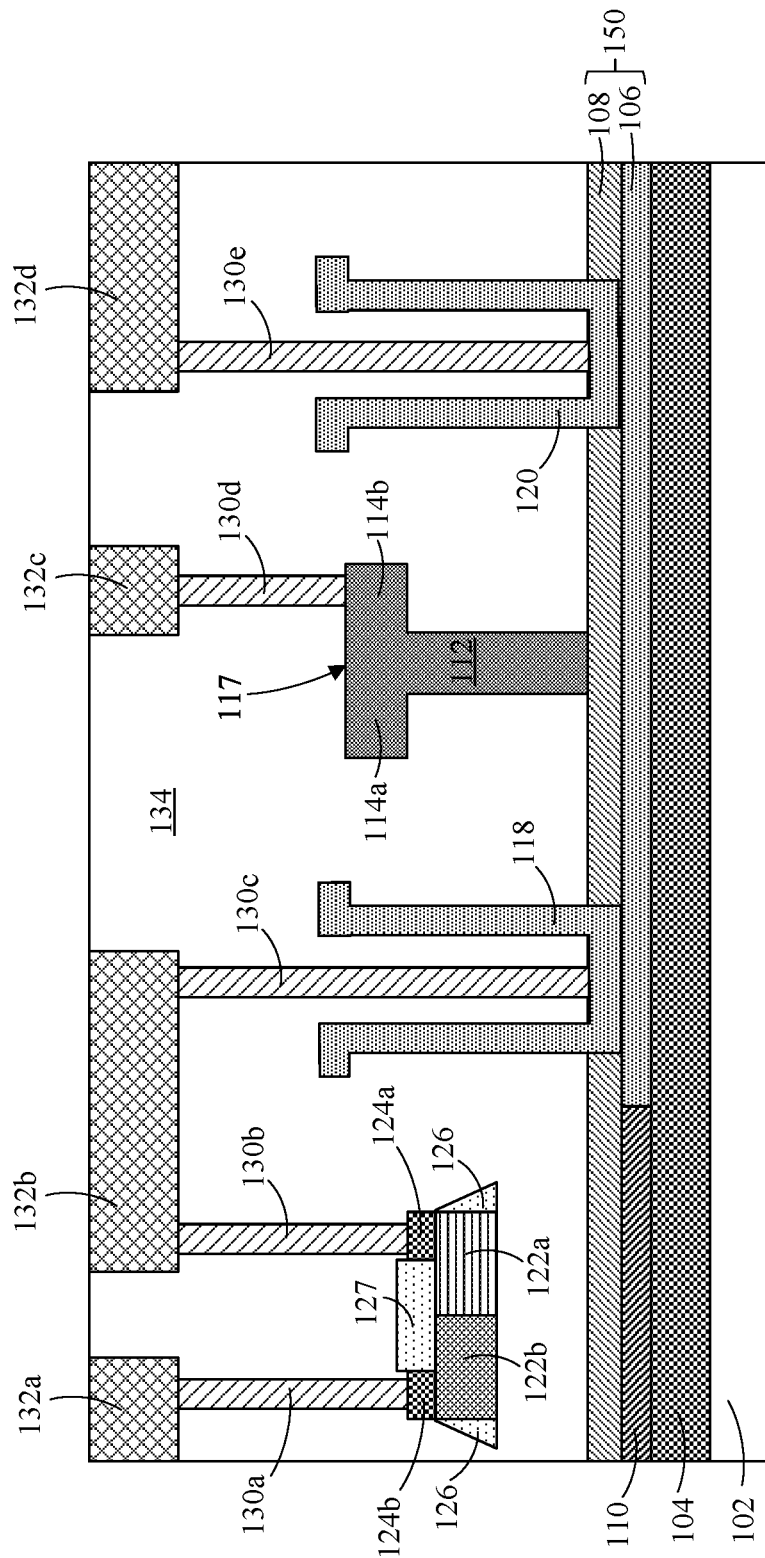

Referring to FIG. 5, in which like reference numerals refer to like features in FIG. 1 through FIG. 4, another example of a semiconductor device is shown. In the example shown in FIG. 5, the polysilicon layer 122 may include a first doped region 122a and a second doped region 122b. In embodiments where the isolation layer 110 is present, both the first doped region 122a and the second doped region 122b may be positioned above or directly above the isolation layer 110 such that the doped regions 122a, 122b are vertically aligned with the isolation layer 110.

The first doped region 122a has a first conductivity type while the second doped region 122b has a second conductivity type. The first conductivity type is different from the second conductivity type. In particular, the first conductivity type may be of an opposite conductivity to the second conductivity type. For example, the first doped region 122a may be of a P-type conductivity while the second doped region 122b may be of an N-type conductivity type. Alternatively, the first doped region 122a may be of an N-type conductivity while the second doped region 122b may be of a P-type conductivity type. In some embodiments, the first doped region 122a may abut or directly abut the second doped region 122b to provide a diode in the polysilicon layer 122.

The polysilicon layer 122 may have an upper surface that is at least partially covered by a silicide layer. For example, as shown in FIG. 5, a first silicide layer 124a may be disposed on or directly on the first doped region 122a of the polysilicon layer 122, and a second silicide layer 124b may be disposed on or directly on the second doped region 122b of the polysilicon layer 122. A nitride block 127 may be disposed on the polysilicon layer 122 to isolate the first silicide layer 124a from the second silicide layer 124b, thereby providing a partially silicided polysilicon layer 122. The first doped region 122a may be electrically connected to the drain electrode 118. For example, the electrical connection may be provided by a connection between the first silicide layer 124a, the interconnect vias 130b, 130c, and the metal line 132b.

Figure 6:
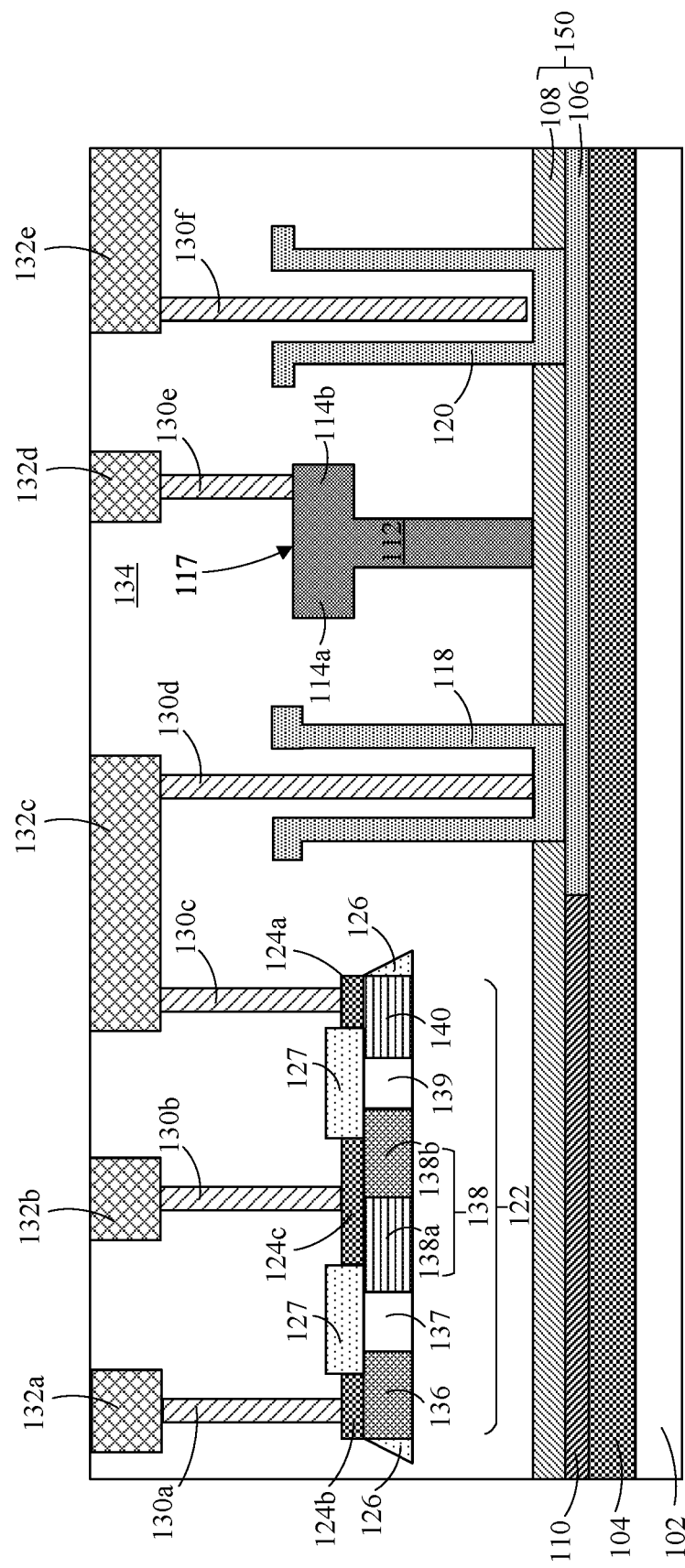

Referring to FIG. 6, in which like reference numerals refer to like features in FIG. 1 through FIG. 5, another example of a semiconductor device is shown. The polysilicon layer 122 may include heavily doped regions and lightly doped regions. In the example shown in FIG. 6, the polysilicon layer 122 may further include a first heavily doped region 136, a second heavily doped region 138, a third heavily doped region 140, a first lightly doped region 137, and a second lightly doped region 139. The heavily doped regions 136, 138, 140 have higher dopant concentrations than the lightly doped regions 137, 139. Each lightly doped region 137, 139 may be positioned laterally between two respective heavily doped regions 136, 138, 140. The lightly doped regions 137, 139 may be intrinsically doped. As used herein, the term "intrinsically doped" may refer to a region that is substantially free of extrinsic doping atoms but may still contain charge carriers provided by other doped portions of the structure.

The second heavily doped region 138 may be positioned laterally between the first heavily doped region 136 and the third heavily doped region 140. The second heavily doped region 138 may include sub-regions 138a, 138b. Sub-region 138a may be laterally adjacent to sub-region 138b. The second heavily doped region 138 may include a diode. For example, the sub-region 138a may be doped with a conductivity type that is opposite of the sub-region 138b. The sub-region 138a may abut or directly abut the sub-region 138b to provide the diode.

The heavily doped region 136 may be of a first conductivity type. The sub-region 138a of the heavily doped region 138 may be of a second conductivity type while the sub-region 138b of the heavily doped region 138 may be of the first conductivity type. The heavily doped region 140 may be of the second conductivity type. The first conductivity type is different from the second conductivity type. In particular, the first conductivity type may be of an opposite conductivity to the second conductivity type.

A silicide layer may be disposed on or directly on each of the heavily doped regions 136, 138, 140. For example, a first silicide layer 124a may be disposed on the heavily doped region 136, a second silicide layer 124b may be disposed on the heavily doped region 138, and a third silicide layer 124c may be disposed on the heavily doped region 140. Nitride blocks 127 may be disposed on the lightly doped regions 137, 139. The silicide layers 124a, 124b, 124c may be isolated from each other by the nitride blocks 127. The heavily doped region 140 may be electrically connected to the drain electrode 118, for example, by interconnect vias 130c, 130d, the metal line 132c, and the first silicide layer 124a. In an embodiment, the heavily doped region 138 may be electrically connected to a heat sink.

Although not shown, it should be understood that the scope of the present disclosure also contemplates modifications of the structures shown in FIG. 5 and FIG. 6 where the isolation layer 110 is absent. Additionally, the present disclosure also contemplates modifications of the structures shown in FIG. 1 through FIG. 6 where the polysilicon layer 122 and the respective doped regions in the polysilicon layer 122 are electrically connected to the source electrode 120, or the gate 112.

FIG. 7, FIG. 8, FIG. 9A, FIG. 9B, FIG. 10 through FIG. 16 show example structures associated with steps that may be used to create an example of the semiconductor device shown in FIG. 2.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 7:
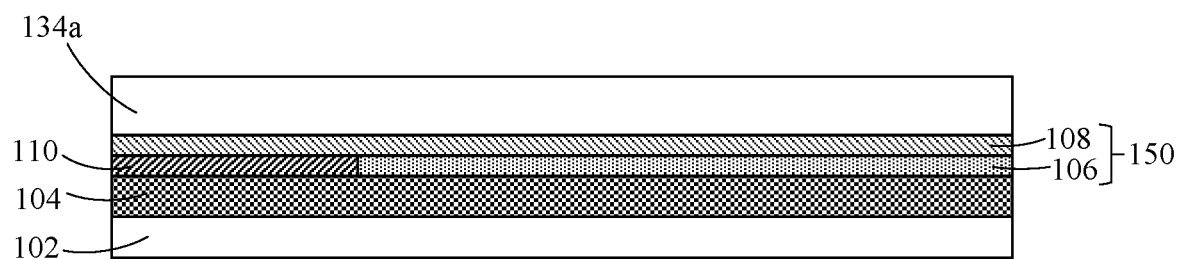
FIG. 7, FIG. 8, FIG. 9A, FIG. 9B, FIG. 10 through FIG. 16 are cross-sectional views depicting structures at various stages of forming a semiconductor device shown in FIG. 2.

Referring to FIG. 7, a device structure for use in fabricating the semiconductor devices of the present disclosure is shown. A buffer layer 104 may be formed on a substrate 102. The substrate 102 may be provided as a semiconductor wafer. An active region 150 may be formed above a substrate 102. For example, a channel layer 106 may be formed on the buffer layer 104, and a barrier layer 108 may be formed on the channel layer 106. A first dielectric layer 134a may be formed on the barrier layer 108 using the deposition techniques described herein. In some embodiments, an isolation layer 110 may be formed between the barrier layer 108 and the buffer layer 104. The isolation layer 110 may be implant-isolated or mesa-isolated. In other embodiments, the forming of the isolation layer 110 may be skipped (i.e., the isolation layer 110 is absent), and the channel layer 106 is between the barrier layer 108 and the buffer layer 104.

Figure 8:
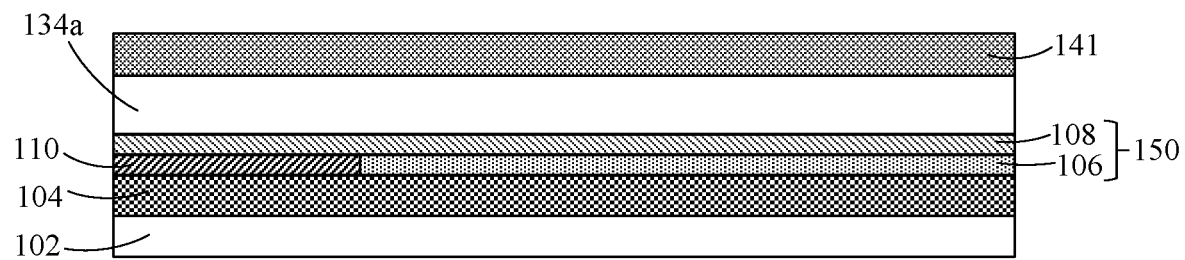

Referring to FIG. 8, a polysilicon material 141 may be formed on the first dielectric layer 134a using the deposition techniques described herein. The deposited polysilicon material 141 may be undoped. Alternatively, a doped polysilicon material 141 may be deposited on the first dielectric layer 134a. The doped polysilicon material 141 may be doped with either a P-type conductivity or an N-type conductivity.

Figure 9A:
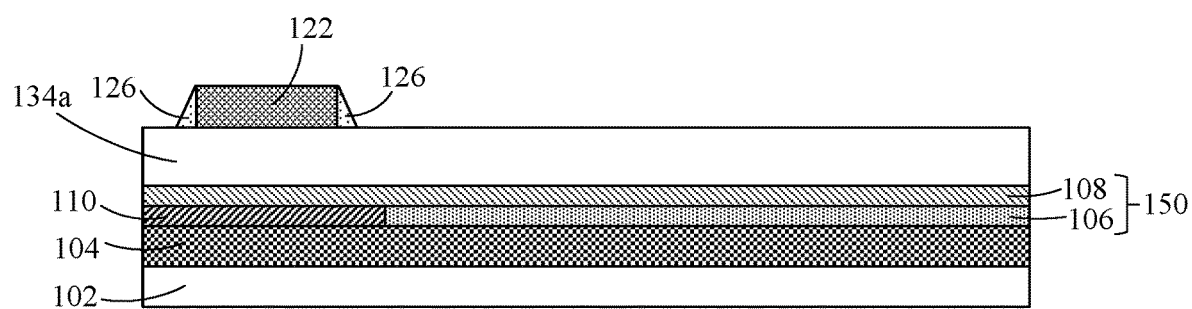

Referring to FIG. 9A, the polysilicon material 141 may be patterned to form a polysilicon layer 122 using the patterning techniques described herein. In embodiments where the polysilicon material 141 was undoped, a doping step may be performed to dope the polysilicon layer 122 to have a doped region. The doping of the polysilicon layer 122 may be performed with the use of a mask (not shown). Spacers 126 may be formed on sidewalls of the polysilicon layer 122. For example, a nitride material may be deposited and subsequently anisotropically etched to form the spacers 126. Alternatively, to form the embodiment shown in FIG. 4, the formation of the spacers 126 on the sidewalls of the polysilicon layer 122 may be omitted, thereby leaving the sidewalls of the polysilicon layer 122 exposed.

Figure 9B:
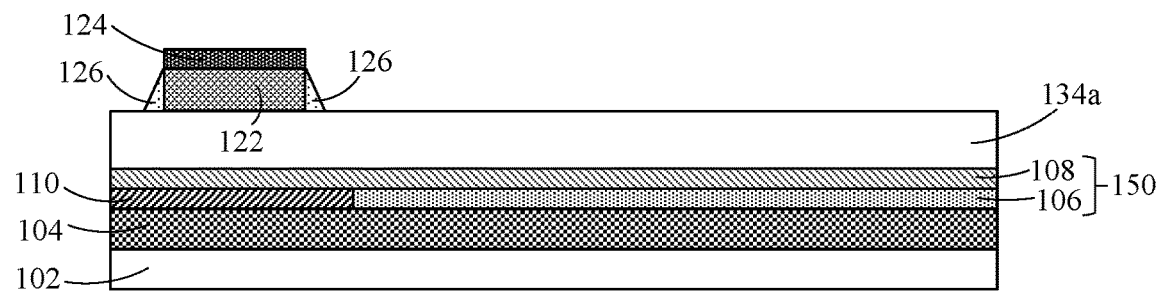

Referring to FIG. 9B, a silicide layer 124 may be formed on the polysilicon layer 122 using a silicidation process. The spacers 126 may serve as a mask to block surfaces of the polysilicon layer where silicidation is not desired. For example, the sidewalls of the polysilicon layer 122 may be covered by the spacers 126 while an upper surface of the polysilicon layer 122 may be exposed. A metallic material (e.g., nickel, nickel-platinum alloy, titanium, or cobalt, etc.) may be formed on the upper surface of the polysilicon layer 122 using a sputtering process. An annealing process may be performed to form the silicide layer 124 on the upper surface of the polysilicon layer 122 from a reaction between the metallic material and the polysilicon. The annealing process may be conducted with a temperature range of about 250° C. to about 750° C. Alternatively, to form the embodiment shown in FIG. 4, the metallic material may be sputtered on the exposed sidewalls and the upper surface of the polysilicon layer 122. The annealing process may be subsequently performed to form the silicide layer 124. In particular, in the absence of spacers 126 blocking the sidewalls of the polysilicon layer 122, the silicide layer 124 may be formed on the upper surface and the sidewalls of the polysilicon layer 122.

Figure 10:
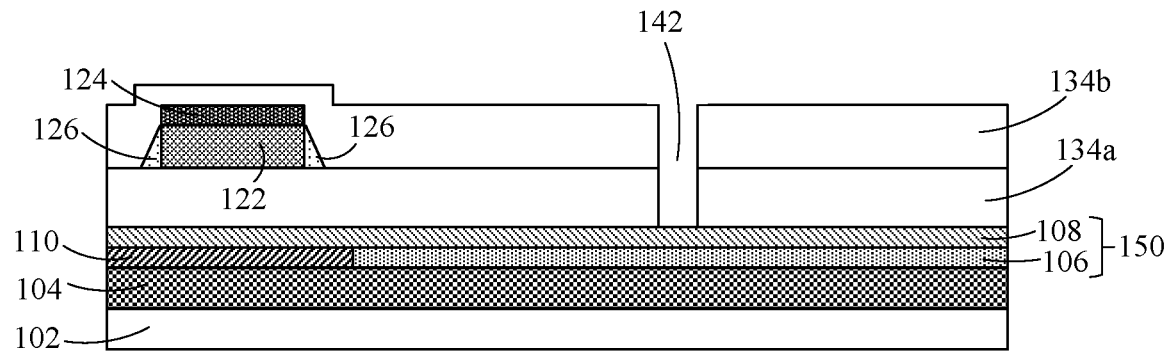

Referring to FIG. 10, a second dielectric layer 134b may be formed on the first dielectric layer 134a using the deposition techniques described herein. For example, the second dielectric layer 134b may be deposited to cover the silicide layer 124 and the polysilicon layer 122. A gate opening 142 may be formed in the dielectric layers 134a, 134b by an etching process. In particular, the gate opening 142 may expose the barrier layer 108.

Figure 11:
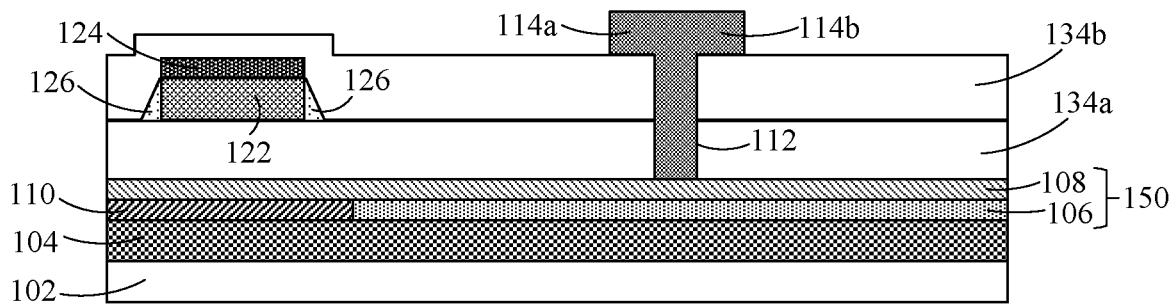

Referring to FIG. 11, a gate 112 may be formed in the gate opening 142. The gate 112 may be formed above the active region 150. In an embodiment, the gate 112 may be formed on the barrier layer 108. The gate 112 may be formed by depositing a metallic material layer (not shown) in the gate opening 142 using the deposition techniques described herein. The deposited layer may be in contact with the barrier layer 108 and extend to lie over the second dielectric layer 134b. The deposited layer may be subsequently patterned using the patterning techniques described herein, with the use of a mask, to form the gate 112. The gate 112 may also have field plate extensions 114a, 114b. The field plate extensions 114a, 114b may be integrally formed with the gate 112 after the patterning of the metallic material layer. The field plate extensions 114a, 114b may be formed on the second dielectric layer 134b.

Figure 12:
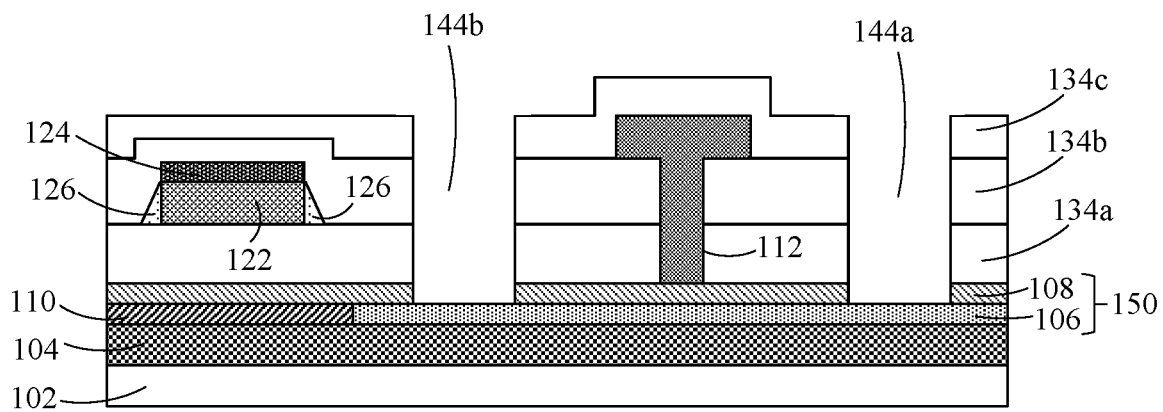

Referring to FIG. 12, a third dielectric layer 134c may be formed on the second dielectric layer 134b using the deposition techniques described herein. Source 144a and drain 144b openings may be formed in the dielectric layers 134a, 134b, 134c by an etching process. A mask may be used in the etching process to define the openings 144a, 144b in the dielectric layers 134a, 134b, 134c. The etching process may also etch through the barrier layer 108 to expose the channel layer 106.

Figure 13:
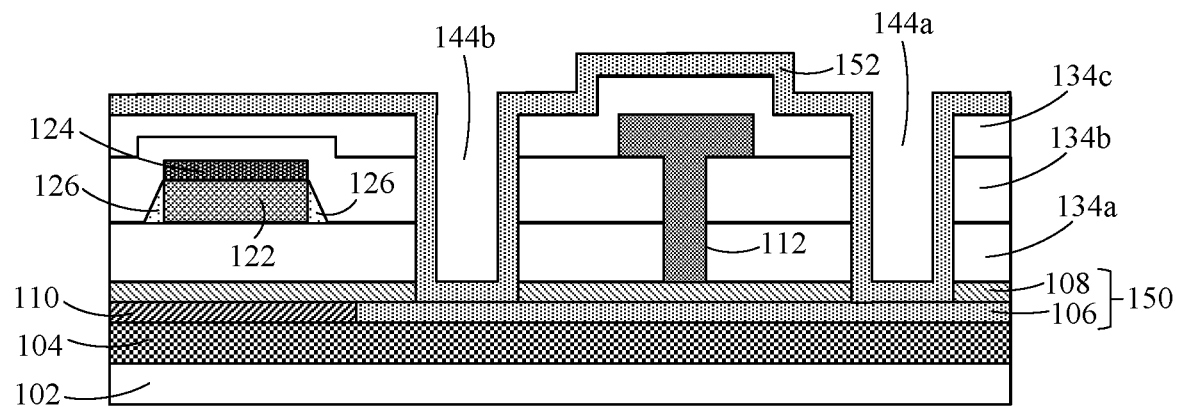

Referring to FIG. 13, an electrode layer 152 may be formed on the third dielectric layer 134c and in the openings 144a, 144b, using the deposition techniques described herein. Preferably, the electrode layer 152 may be formed using a conformal deposition process, such as an ALD process or a highly conformal CVD process. As used herein, the term "conformal" refers to a deposition technique in which the deposited material conforms to the contours of the surface or structure being deposited on. The conformal deposition process may provide the electrode layer 152 with a uniform thickness. As shown in FIG. 13, the deposited electrode layer 152 may conform to sidewalls of the openings 144a, 144b and contact the channel layer 106.

Figure 14:
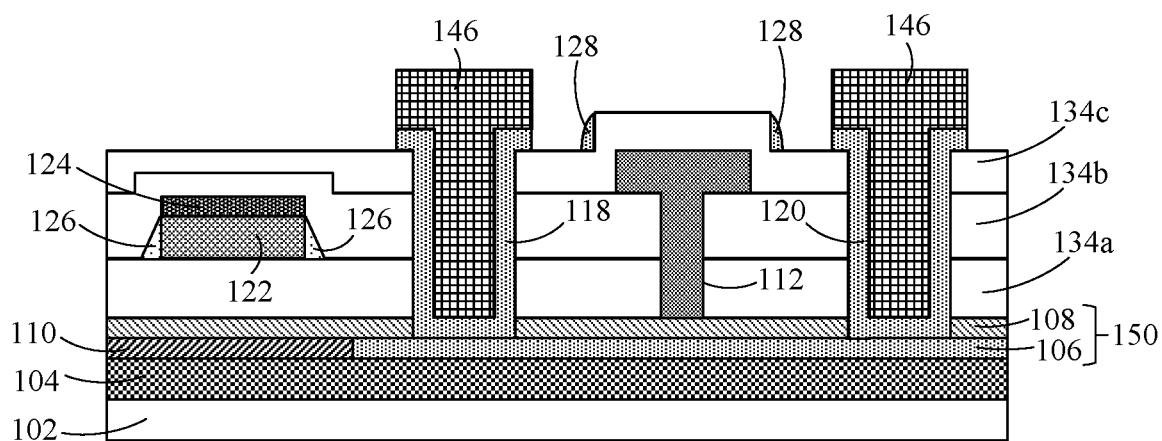

Referring to FIG. 14, the electrode layer 152 may be patterned using the patterning techniques described herein to form a source electrode 120 and a drain electrode 118. For example, a mask element 146 may be deposited in each of the openings 144a, 144b. The mask element 146 may fill the openings 144a, 144b and cover portions of the electrode layer 152. Portions of the electrode layer 152 not covered by the mask elements 146 may be removed using the patterning techniques described herein (e.g., an etching process). In some examples, the etching of the electrode layer 152 may leave behind electrode spacers 128 on the third dielectric layer 134c, in which the gate 112 may be laterally between the electrode spacers 128. In other examples, the etching of the electrode layer 152 does not leave behind the electrode spacers 128.

Figure 15:
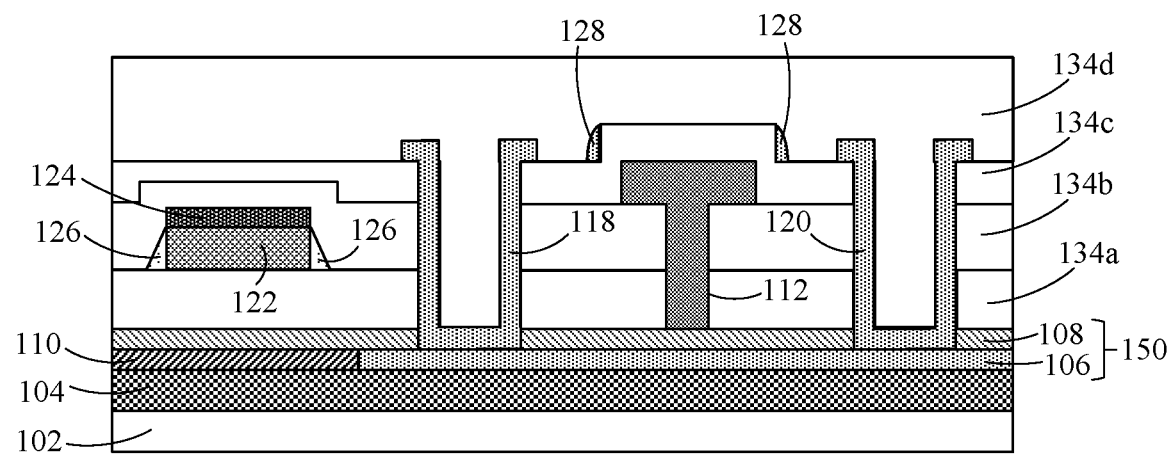

Referring to FIG. 15, the mask element 146 may be removed (e.g., using an ashing step) after the formation of the source electrode 120 and the drain electrode 118. The removal of the mask element 146 may expose the source electrode 120 and the drain electrode 118. A fourth dielectric layer 134d may be formed on the third dielectric layer 134c, the source electrode 120, and the drain electrode 118.

Figure 16:
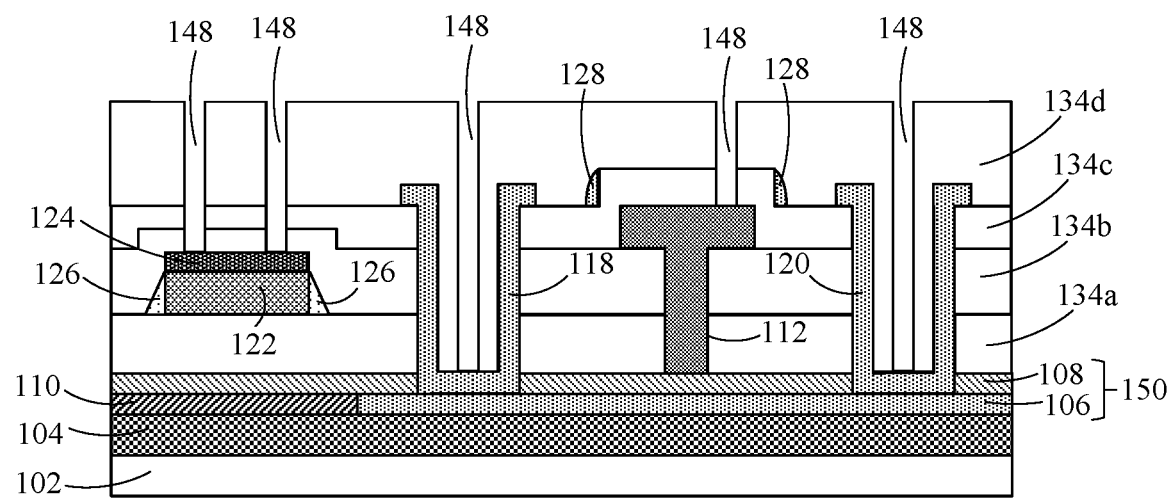

Referring to FIG. 16, contact openings 148 may be formed in the dielectric layers 134a, 134b, 134c, 134d. For example, the dielectric layers 134a, 134b, 134c, 134d may be patterned by performing an etching process with the use of a mask. The contact openings 148 may expose portions of the silicide layer 124, the source electrode 120, the drain electrode 118, and the gate 112.

The structure shown in FIG. 16 may be subjected to further processing. For example, interconnect vias may be formed in the contact openings 148 (e.g., using a damascene process, or deposition of metals). A chemical mechanical planarization (CMP) step may be performed thereafter to planarize the upper surfaces of the interconnect vias. Metal lines may be formed on the planarized interconnect vias. The dielectric layers 134a, 134b, 134c, 134d may provide an interlayer dielectric region, in which the interconnect vias and the metal lines may be disposed in.

Figure 17A:
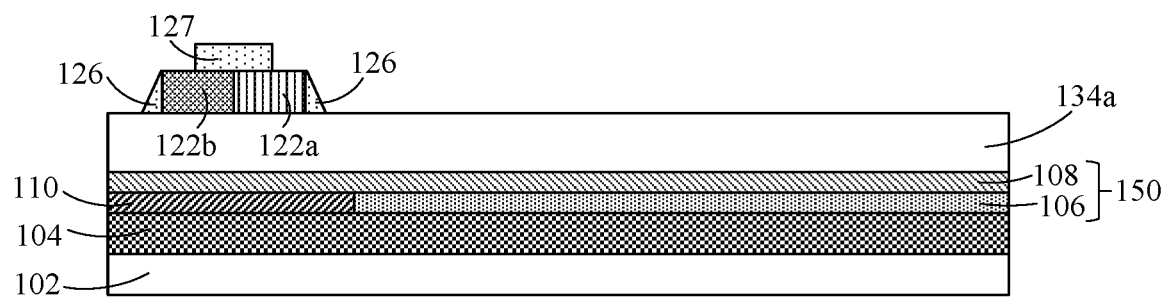
FIG. 17A and FIG. 17B are cross-sectional views depicting structures at stages subsequent to FIG. 7 for forming a semiconductor device shown in FIG. 5.
Figure 17B:
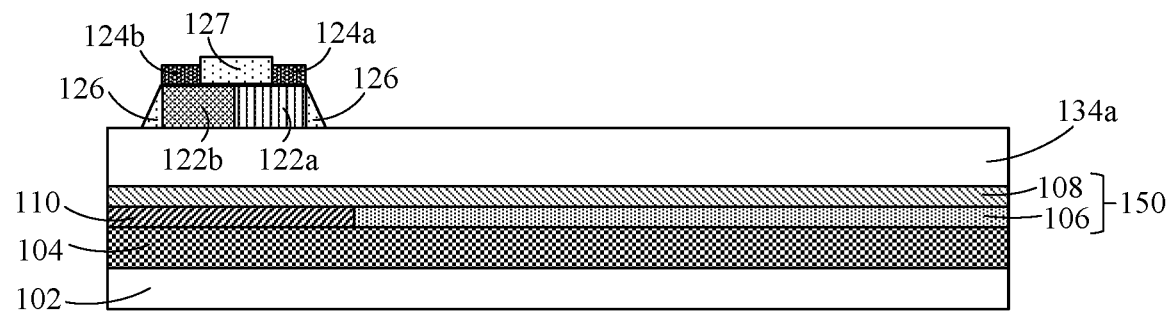

FIG. 17A and FIG. 17B show structures at stages subsequent to FIG. 8 for forming a semiconductor device having a polysilicon layer including a first doped region and a second doped region. Referring to FIG. 17A (FIG. 17A continues from the structure shown in FIG. 8), the polysilicon material 141 may be patterned to form a polysilicon layer 122 using the patterning techniques described herein. In embodiments where the polysilicon material 141 was undoped, a doping step may be performed to dope the polysilicon layer 122 to have a first doped region 122a and a second doped region 122b. A mask may be used in the doping step. The first doped region 122a may be doped with a first conductivity type while the second doped region 122b may be doped with a second conductivity type. In embodiments where the polysilicon material 141 was doped, an additional doped polysilicon material may be deposited adjacent to the patterned polysilicon material 141 to form the first doped region 122a of the polysilicon layer 122 and the second doped region 122b of the polysilicon layer 122.

Spacers 126 may be formed on sidewalls of the polysilicon layer 122. A nitride block 127 may be formed on an upper surface of the polysilicon layer 122. The spacers 126 and the nitride block 127 may be formed by depositing and subsequently etching a nitride material. The upper surface of the polysilicon layer 122 may be partially covered by the nitride block 127 such that an upper surface of the first doped region 122a and an upper surface of the second doped region 122b are exposed.

Referring to FIG. 17B, a first silicide layer 124a may be formed on the first doped region 122a of the polysilicon layer 122, and a second silicide layer 124b may be formed on the second doped region 122b of the polysilicon layer 122. The first silicide layer 124a may be isolated from the second silicide layer 124b by the nitride block 127.

Formation of the first silicide layer 124a and the second silicide layer 124b may be performed using a silicidation process. The spacers 126 and the nitride block 127 may serve as masks to block surfaces of the polysilicon layer 122 where silicidation is not desired. A metallic material (e.g., nickel, nickel-platinum alloy, titanium, or cobalt, etc.) may be formed (e.g., using a sputtering process) on the exposed upper surface of the first doped region 122a and the exposed upper surface of the second doped region 122b. An annealing process may be performed to form the first silicide layer 124a and the second silicide layer 124b from a reaction between the metallic material and the polysilicon. The annealing process may be conducted with a temperature range of about 350° C. to about 750° C. Subsequently, the structure shown in FIG. 17B may be subjected to similar processes described in FIG. 10 through FIG. 16 to form the exemplary semiconductor device shown in FIG. 5.

Figure 18A:
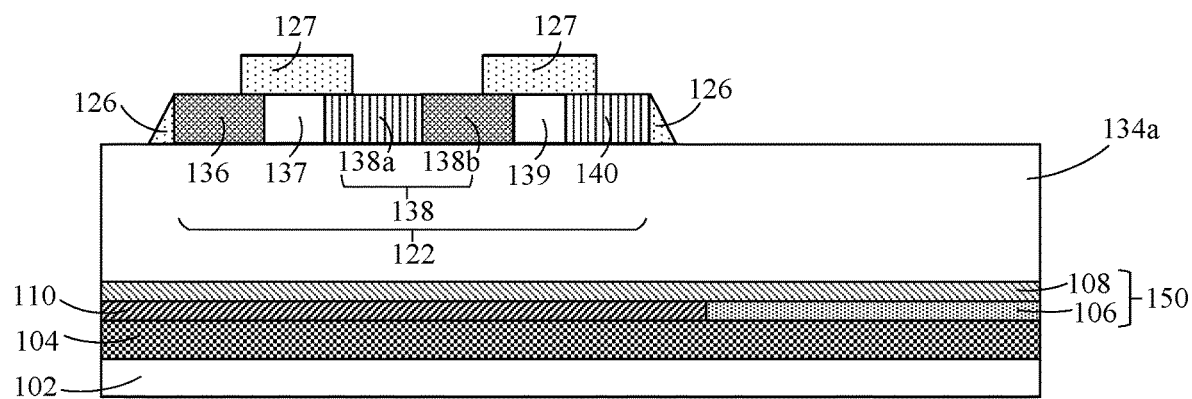
FIG. 18A and FIG. 18B are cross-sectional views depicting structures at stages subsequent to FIG. 7 for forming a semiconductor device shown in FIG. 6.
Figure 18B:
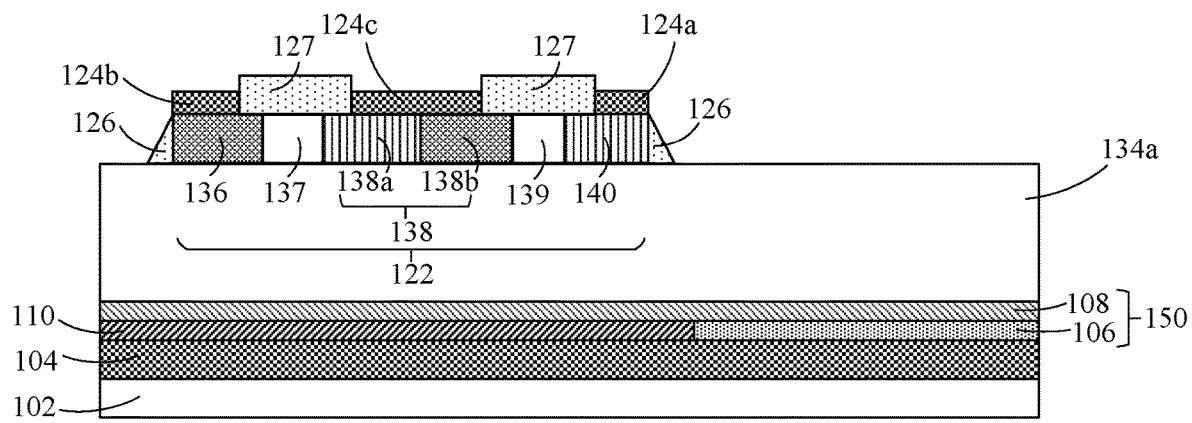

FIG. 18A and FIG. 18B show structures at stages subsequent to FIG. 8 for forming a semiconductor device having a polysilicon layer including heavily and lightly doped regions. Referring to FIG. 18A (FIG. 18A continues from the structure shown in FIG. 8), the polysilicon material 141 may be patterned, using the patterning techniques described herein, to form a polysilicon layer 122. The polysilicon layer 122 may be doped to have heavily doped regions 136, 138, 140 and lightly doped regions 137, 139.

In an example, the polysilicon layer 122 may be doped to have a first heavily doped region 136 of a first conductivity type, a second heavily doped region 138, a third heavily doped region 140 of a second conductivity type, a first lightly doped region 137, and a second lightly doped region 139. The first lightly doped region 137 may be formed laterally between the first heavily doped region 136 and the second heavily doped region 138. The second lightly doped region 139 may be formed laterally between the second heavily doped region 138 and the third heavily doped region 140. The second heavily doped region 138 may additionally include a first sub-region 138a and a second sub-region 138b. The first sub-region 138a may be of the first conductivity type while the second sub-region 138b may be of the second conductivity type.

The forming of the doped regions in the polysilicon layer 122 may involve one or more doping steps (e.g., ion implantation) with the use of one or more masks, and a heating step (e.g., annealing). As an example, the heavily doped regions 136, 138, 140 may be formed by ion implantation. An anneal process may be performed after the ion implantation. The lightly doped regions 137, 139 may be formed by a thermal diffusion of the dopants from the respective adjacent heavily doped regions 136, 138, 140.

Spacers 126 may be formed on sidewalls of the polysilicon layer 122. Nitride blocks 127 may be formed on the lightly doped regions 137, 139. The nitride blocks 127 may also extend to partially cover the upper surfaces of the respective heavily doped regions 136, 138, 140. The spacers 126 and the nitride blocks 127 may be formed by depositing and subsequently etching a nitride material.

Referring to FIG. 18B, a first silicide layer 124a may be formed on the first heavily doped region 136, a second silicide layer 124b may be formed on the second heavily doped region 138, and a third silicide layer 124c may be formed on the third heavily doped region 140. The nitride blocks 127 may serve to isolate the first silicide layer 124a from the third silicide layer 124c, and the second silicide layer 124b from the third silicide layer 124c.

Formation of the first silicide layer 124a, the second silicide layer 124b, and the third silicide layer 124c may be performed using a silicidation process. The spacers 126 and the nitride block 127 may serve as masks to block surfaces of the doped regions 136, 137, 138, 139, 140 in the polysilicon layer 122 where silicidation is not desired. A metallic material (e.g., nickel, nickel-platinum alloy, titanium, or cobalt, etc.) may be formed (e.g., using a sputtering process) on the exposed upper surface of the first heavily doped region 136, the exposed upper surface of the second heavily doped region 138, and the exposed upper surface of the third heavily doped region 140. An annealing process may be performed to form the silicide layers 124a, 124b, 124c from a reaction between the metallic material and the polysilicon. The annealing process may be conducted with a temperature range of about 350° C. to about 750° C. Subsequently, the structure shown in FIG. 18B may be subjected to similar processes described in FIG. 10 through FIG. 16 to form the exemplary semiconductor device shown in FIG. 6.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, high power electronic devices, communication devices, high electron mobility transistors, etc.

What is claimed is:

1. A semiconductor device comprising:
an active region above a substrate, the active region comprising at least two material layers with different band gaps, wherein the active region comprises a channel layer and a barrier layer disposed on the channel layer;
source and drain electrodes in contact with the active region;
a gate above the active region, the gate is laterally between the source and drain electrodes, the gate has an upper surface;
a polysilicon layer above the substrate, the polysilicon layer has a lower surface, wherein the polysilicon layer is positioned laterally adjacent to the gate and the lower surface of the polysilicon layer is substantially coplanar with the upper surface of the gate; and
a silicide layer on the polysilicon layer.

2. The device of claim 1, further comprising an isolation layer above the substrate, the isolation layer being adjacent to the channel layer.

3. The device of claim 2, wherein the polysilicon layer is positioned above the isolation layer.

4. The device of claim 3, wherein the polysilicon layer is vertically aligned with the isolation layer.

5. The device of claim 1, wherein the gate comprises field plate extensions that extend laterally from the gate towards the source and drain electrodes.

6. The device of claim 1, further comprising:
a buffer layer disposed on the substrate, wherein the channel layer is disposed on the buffer layer, and the isolation layer disposed on the buffer layer.

7. The device of claim 1, wherein the polysilicon layer is electrically connected to either the drain electrode or the source electrode.

8. The device of claim 1, wherein the polysilicon layer includes at least one doped region, the doped region having a conductivity type.

9. The device of claim 8, wherein the polysilicon layer includes a first doped region with a first conductivity type and a second doped region with a second conductivity type, the first conductivity type being different from the second conductivity type.

10. The device of claim 9, wherein first doped region abuts the second doped region to provide a diode.

11. The device of claim 7, wherein the polysilicon layer is configured as an electronic fuse.

12. The device of claim 11, wherein the gate is configured to program the electronic fuse.

13. The device of claim 1, wherein the polysilicon layer is configured as a resistor.

14. A semiconductor device comprising:
a buffer layer on a substrate;
an active region above the substrate, the active region comprising a channel layer disposed on the buffer layer, and a barrier layer disposed on the channel layer;
source and drain electrodes in contact with the channel layer;
a gate on the barrier layer, the gate is laterally between the source and drain electrodes, the gate has an upper surface;
a polysilicon layer above the barrier layer, the polysilicon layer has a lower surface, the polysilicon layer is positioned laterally adjacent to the gate, and the lower surface of the polysilicon layer is substantially coplanar with the upper surface of the gate, wherein the polysilicon layer comprises heavily doped regions and lightly doped regions; and
a silicide layer on each of the heavily doped regions.

15. The device of claim 14, wherein each of the lightly doped regions is positioned laterally between two heavily doped regions.

16. The device of claim 15, wherein the polysilicon layer comprises:
a first heavily doped region of a first conductivity type;
a second heavily doped region having a first sub-region and a second sub-region, wherein the first sub-region is of a second conductivity type and the second sub-region is of the first conductivity type, the second conductivity type being different from the first conductivity type;
a third heavily doped region of the second conductivity type;
a first lightly doped region positioned laterally between the first heavily doped region and the second heavily doped region; and
a second lightly doped region positioned laterally between the second heavily doped region and the third heavily doped region.

17. The device of claim 16, wherein the first sub-region of the second heavily doped region abuts the second sub-region of the second heavily doped region.

18. The device of claim 17, further comprising:
a first silicide layer on the first heavily doped region;
a second silicide layer on the second heavily doped region; and
a third silicide layer on the third heavily doped region.

19. A method of forming a semiconductor device comprising:
forming an active region above a substrate, the active region comprising at least two material layers with different band gaps, wherein the active region comprises a channel layer and a barrier layer disposed on the channel layer;
forming source and drain electrodes to contact the active region;
forming a gate above the active region, the gate is laterally between the source and drain electrodes, the gate has an upper surface;

forming a polysilicon layer above the substrate, the polysilicon layer has a lower surface, wherein the polysilicon layer is positioned laterally adjacent to the gate and the lower surface of the polysilicon layer is substantially coplanar with the upper surface of the gate; and
forming a silicide layer on the polysilicon layer.

* * * * *